US009134634B2

(12) United States Patent
Yoon et al.

(10) Patent No.: US 9,134,634 B2
(45) Date of Patent: Sep. 15, 2015

(54) CONTROL DEVICE FOR PREVENTING MEANDERING OF PATTERNS ON PATTERNED FILMS

(75) Inventors: Young Geun Yoon, Pyeongtaek-si (KR); Il Woo Park, Suwon-si (KR); Yong Hwan Kim, Chungju-si (KR); Bong Jin Choi, Pyeongtaek-si (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 594 days.

(21) Appl. No.: 13/452,828

(22) Filed: Apr. 21, 2012

(65) Prior Publication Data

US 2012/0271447 A1    Oct. 25, 2012

(30) Foreign Application Priority Data

Apr. 22, 2011  (KR) .................. 10-2011-0037635
Sep. 22, 2011  (KR) .................. 10-2011-0095852

(51) Int. Cl.
*G06F 19/00* (2011.01)
*G03F 9/00* (2006.01)
*B65H 23/02* (2006.01)

(52) U.S. Cl.
CPC .......... *G03F 9/7088* (2013.01); *B65H 23/0216* (2013.01); *B41P 2233/52* (2013.01); *B65H 2301/5111* (2013.01); *B65H 2553/42* (2013.01); *B65H 2801/61* (2013.01)

(58) Field of Classification Search
CPC ..................................................... G05B 19/18
USPC ............................. 700/110; 72/255; 156/378
See application file for complete search history.

(56) References Cited

U.S. PATENT DOCUMENTS

| 2005/0184872 | A1* | 8/2005 | Clare et al. ................. 340/572.1 |
| 2006/0241878 | A1* | 10/2006 | Jung et al. ........................ 702/60 |
| 2007/0022798 | A1* | 2/2007 | Morinaga et al. ............... 72/255 |
| 2007/0053310 | A1* | 3/2007 | Ishizawa et al. .............. 370/272 |
| 2007/0074145 | A1* | 3/2007 | Tanaka ........................... 716/21 |
| 2008/0199136 | A1* | 8/2008 | Nakane ......................... 385/126 |
| 2008/0246189 | A1* | 10/2008 | Kuzuhara et al. ............. 264/334 |
| 2009/0169772 | A1* | 7/2009 | Yamada et al. ................ 428/1.1 |
| 2011/0083790 | A1* | 4/2011 | Kimura et al. .................. 156/64 |
| 2011/0086193 | A1* | 4/2011 | Nakazono et al. ........... 428/41.8 |

* cited by examiner

Primary Examiner — Robert Fennema
Assistant Examiner — Anthony Whittington
(74) Attorney, Agent, or Firm — The PL Law Group, PLLC

(57) ABSTRACT

A control device for preventing meandering of patterns for use in a patterned film manufacturing device which includes a film transferring equipment and a pattern forming equipment, includes a marking unit that forms markings on a predetermined reference position on the film, a recognizing unit that is located at the rear of the marking unit and recognizes positions of the markings on the film, a computing unit that computes an amount of meandering based on differences between the reference position and the recognized positions of the markings, a control unit that generates a correction signal for correcting positions of the marking unit and the pattern forming equipment corresponding to the computed the amount of meandering, and a correction unit that receives the correction signal and corrects positions of the marking unit and the pattern forming equipment based on the received correction signal.

21 Claims, 18 Drawing Sheets

CONTROL DEVICE FOR PREVENTING MEANDERING OF PATTERNS ON PATTERNED FILMS

CROSS-REFERENCE TO RELATED APPLICATION AND CLAIM OF PRIORITY

This application claims priority to Korean Patent Application Nos. 10-2011-0037635, filed on Apr. 22, 2011 and 10-2011-0095852 filed on Sep. 22, 2011, the entire contents of which are incorporated herein by reference in its entirety.

BACKGROUND

1. Technical Field

The present invention relates to a control device for preventing meandering of patterns which enables to mark patterns on exact positions on a film.

2. Related Art

Along with an explosion in demands for high-definition three-dimensional displays, demands for precise patterned optical films also increases. The patterned film can be manufactured by, for example, forming patterns on a sheet-typed base film as described in JP 2003-337226. However, in many cases, considering manufacturing, etc., the patterned film is manufactured by forming patterns on a roll-typed base film while the film is steadily being unrolled.

Meandering of patterns occurs for various reasons. For example, the central axis of the film can be deviated when the film has not been properly rolled. Even if the film has rolled properly, the meandering can occur when the film is not properly balanced or an external force is applied to the film.

Regardless of the reason, the meandering causes defects in quality of films because when the meandering occurs, it is unable to form precise patterns on a film. FIG. 1A shows that a pattern forming apparatus forms patterns on a constant position regardless of the meandering, and FIG. 1B shows an actual trace of the patterns on the film which has been formed in FIG. 1A.

Moreover, especially when manufacturing patterned films for three-dimensional display, inaccurate patterns can cause problems for constructing proper three-dimensional images.

An edge position controller (EPC) is usually used for preventing meandering of the patterns. However, there are limits for forming patterns at the micrometer level because the EPC can control the position of the patterns only at the millimeter level.

Meanwhile, there was another method for recognizing meandering of patterns by comparing distances between formed patterns on the film, however, this method can detect the meandering only after the patterns are formed. Therefore, a new technology for detecting meandering of patterns in real-time is needed.

SUMMARY

According to an aspect of the present invention, the present invention is to provide a device which is capable of controlling meandering of patterns on a film.

According to an aspect of the present invention, the present invention is to provide a control device which is capable of detecting meandering of patterns before the patterns are marked on a film and correcting marking positions of the patterns.

According to an aspect of the present invention, the present invention is to provide a method for controlling meandering of patterns using the control device alone or in combination with an edge position controller.

According to an aspect of the present invention, the present invention, a control device for preventing meandering of patterns for use in a patterned film manufacturing device, includes a film transferring equipment and a pattern forming equipment, including: a marking unit that forms markings on a predetermined reference position on the film, the predetermined reference position being positioned using the film transferring equipment as a reference; a recognizing unit, located at the rear of the marking unit, that recognizes positions of the markings on the film; a computing unit that computes an amount of meandering based on differences between the reference position and the recognized positions of the markings; a control unit that generates a correction signal for correcting positions of the marking unit and the pattern forming equipment corresponding to the computed the amount of meandering; and a correction unit that receives the correction signal and corrects positions of the marking unit and the pattern forming equipment based on the received correction signal.

The present invention also provides a method for controlling meandering of patterns using the control device.

BRIEF DESCRIPTION OF DRAWINGS

The above and other aspects, features and other advantages of the present invention will be more clearly understood from the following detailed description taken in conjunction with the accompanying drawings, in which.

DETAILED DESCRIPTION

Exemplary embodiments of the present invention will be described in detail below with reference to the accompanying drawings, and the present invention is not limited thereto.

According to an embodiment of the present invention relates to a control device for preventing meandering of patterns for use in a patterned film manufacturing device which includes a film transferring equipment and a pattern forming equipment, including: a marking unit that forms markings on a predetermined reference position on the film, the predetermined reference position being positioned using the film transferring equipment as a reference; a recognizing unit, located at the rear of the marking unit, that recognizes positions of the markings on the film; a computing unit that computes an amount of meandering based on differences between the reference position and the recognized positions of the markings; a control unit that generates a correction signal for correcting positions of the marking unit and the pattern forming equipment corresponding to the computed the amount of meandering; and a correction unit that receives the correction signal and corrects positions of the marking unit and the pattern forming equipment based on the received correction signal.

Hereinafter, an embodiment of the present invention is described in detail.

Figure 7:
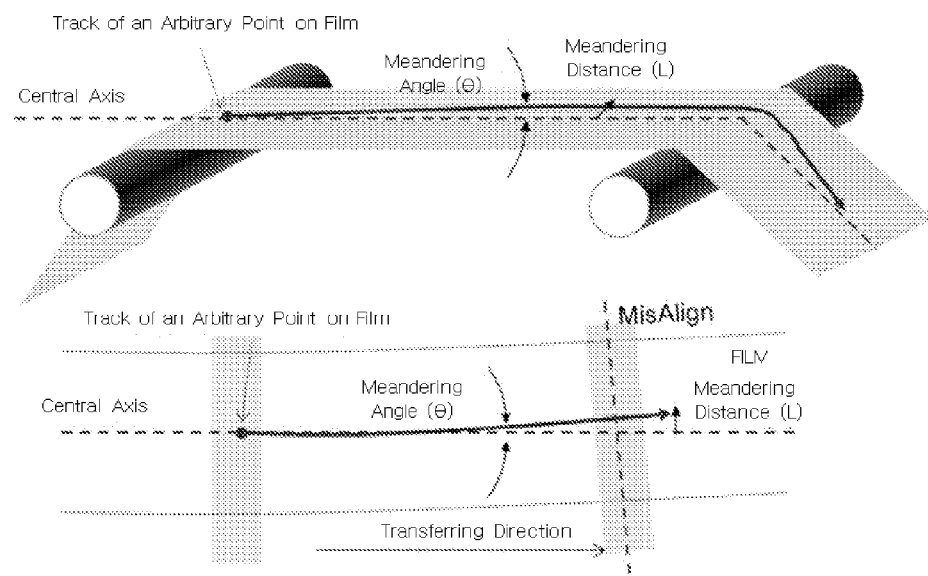
FIG. 7 illustrates a meandering distance and a meandering angle.

In the present invention, meandering of a pattern includes every cases in which a central line of a film transferring equipment and a track of an arbitrary point on a film are not parallel to each other (refer to FIG. 7.) The amount of the meandering can be arithmetically denoted using a meandering distance L and a meandering angle θ. For example, if a central axis of a rolled film moves a certain amount of distance in a lateral direction (a direction perpendicular to a transferring direction of the film), the meandering distance L is same as the amount of moving distance of the rolled film and the meandering angle θ is 0°.

Two basic principles for controlling meandering of a pattern on a film in embodiments of the present invention are as follows.

When meandering (i.e., movement of a central axis of a film and/or change in a transferring direction of the film) is occurred between a marking unit and a recognizing unit, the recognizing unit recognizes that markings marked by the marking unit has moved in a meandering direction (i.e., a direction where the central axis has moved or changed transferring direction) by the amount of the movement of the central axis or the amount of change in the transferring direction.

When meandering is occurred before forming markings on a film, the markings are formed in the opposite direction of a meandering direction (i.e., a direction where the central axis has moved or changed transferring direction) by the amount of the movement of the central axis or the amount of change in the transferring direction, when seen from the film.

FIGS. 2A through 2D show the above-mentioned principles. FIGS. 2A through 2D illustrate cases including a marking unit which has a fixed first marking unit and an adjustable second marking unit.

Figure 1A:
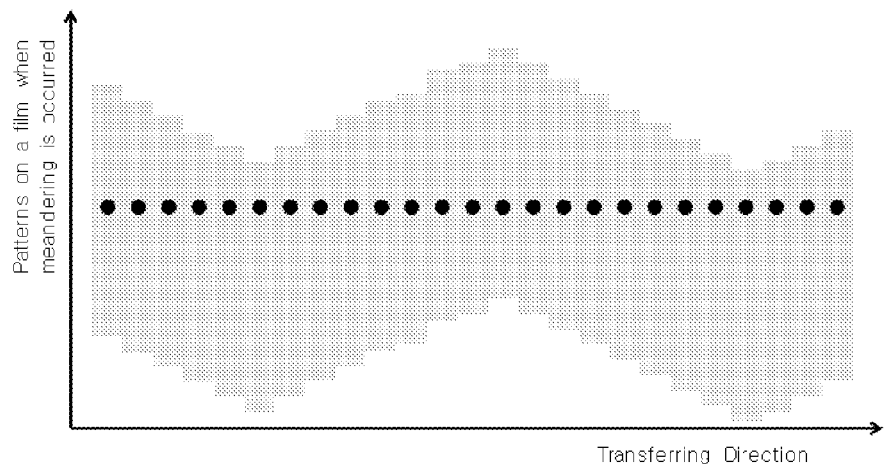
FIGS. 1A and 1B show an example of an error occurred by meandering of a film.
Figure 1B:
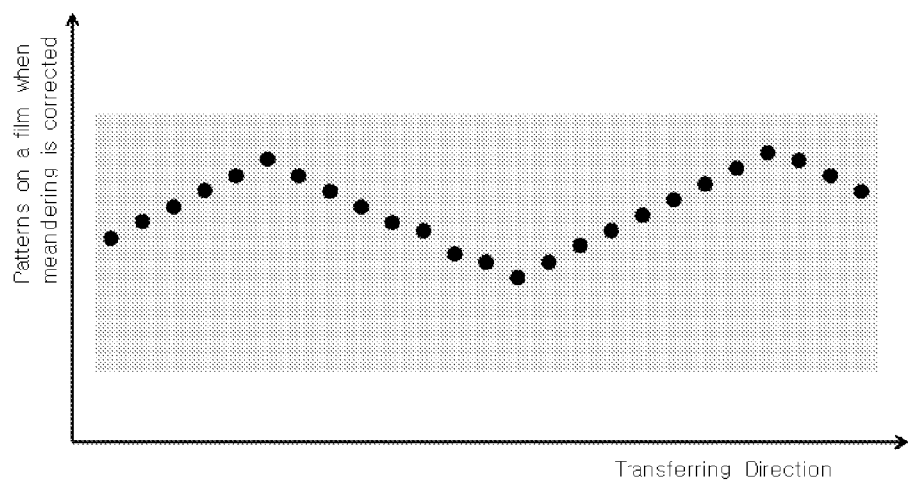
Figure 2A:
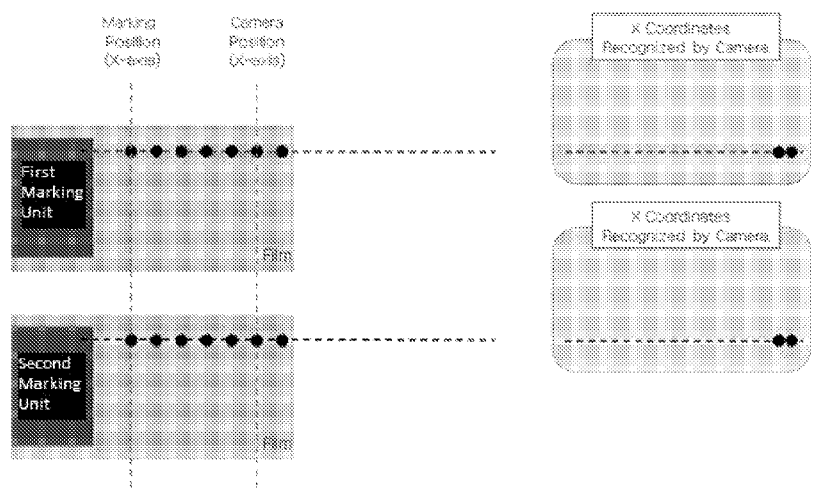
FIG. 2A through 2D illustrates reasons why a position of a making unit needs to be corrected according to the meandering of a film.

As shown in FIG. 2A, when meandering is not occurred, a recognizing unit recognizes that markings are formed at their normal position by the marking unit.

Figure 2B:
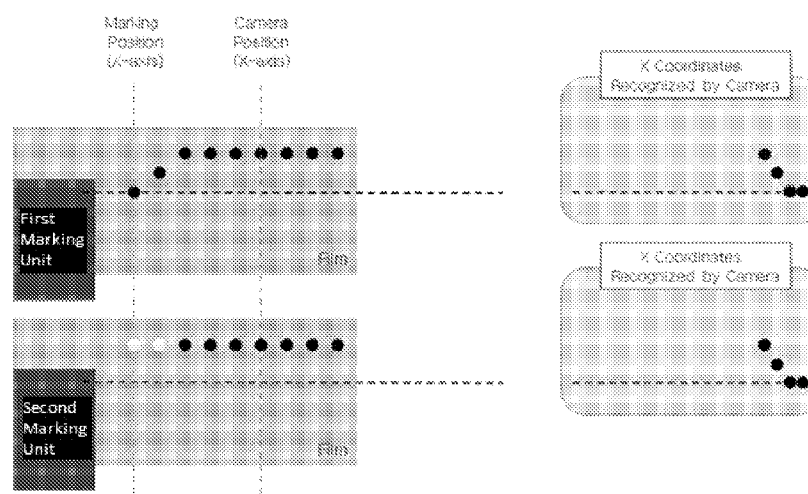

As shown in FIG. 2B, when meandering is occurred, patterns on the film gradually move to one side due to the meandering and the recognizing unit recognizes the moving. However, because the position of the marking unit does not move, the markings formed by the marking unit gradually move to the other side of the film due to the relative position between the marking unit and the film. This can be corrected by moving the position of the marking unit and the pattern forming equipment according to the amount of the meandering.

Figure 2C:
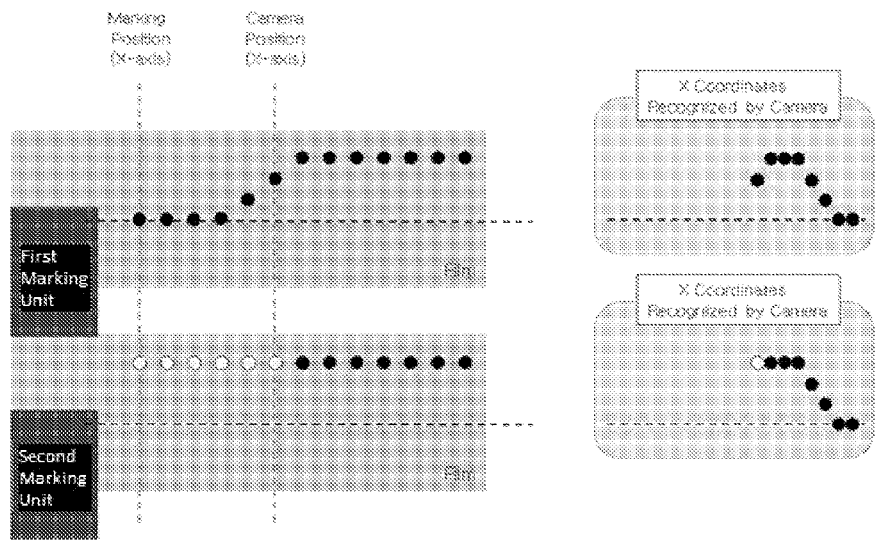

As shown in FIG. 2C, when the meandering is stabilized, the recognizing unit recognizes that the markings which have been marked before correcting positions of the marking unit and the pattern forming equipment move to the one side and then the other side. On the other hand, markings which have been marked after adjusting positions of the marking unit and the pattern forming equipment are recognized to move to one side in accordance with the moving of the film and keep the moved position.

Figure 2D:
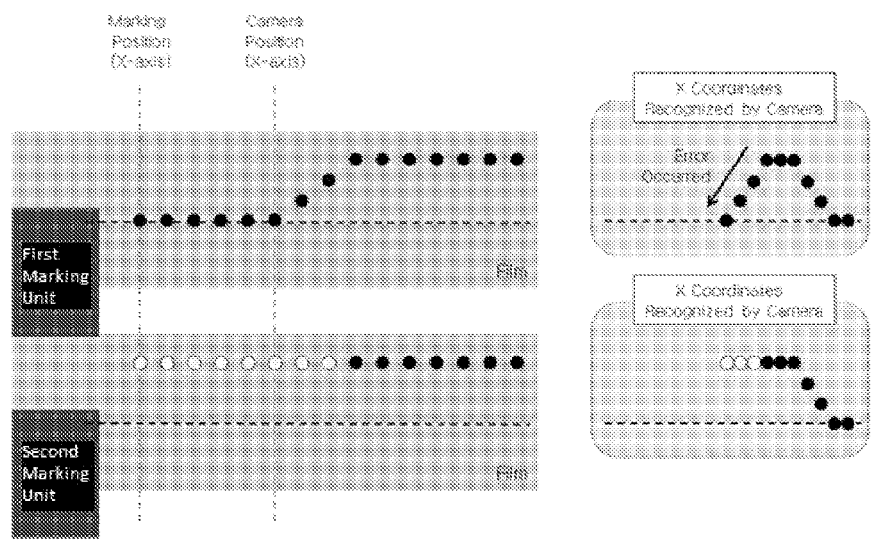

Finally, as shown in FIG. 2D, if the positions of the marking unit and the pattern forming equipment are not corrected according to the meandering, the recognizing unit recognizes that the markings have returned to the original position while the central axis of the film still deviates from the original position. Moreover, in this case, it is impossible to form the pattern on the film correctly because the borders of the patterns overlap each other.

To solve the above-mentioned problem (being unable to recognize the deviation of the central axis of a film), a meandering control device according to the present invention is configured to move positions of a marking unit and a pattern forming equipment in accordance with meandering of a film.

The control device for preventing meandering of patterns of an embodiment of the present invention is described in detail below.

The control device is used for a patterned film manufacturing device including a film transferring equipment and a pattern forming equipment.

An example of the patterned film may be a patterned retarder for implementing 3-dimensional images. The pattern forming equipment is an apparatus for forming patterns on a film. For example, the pattern forming equipment may be an exposure apparatus including a light source and a mask, or a roll. A patterned axis of the mask or the roll may be perpendicular to the unrolling direction of the film.

The control device of the embodiment of the present invention can be used when forming patterns on a sheet-typed film, and it may be used for continuously forming patterns on a roll-typed film.

The control device of the embodiment of the present invention includes a marking unit that forms markings on a film.

A reference position of the marking unit is determined using a position of a fixed film transferring equipment as a reference, so that it can form markings on a fixed point regardless of the meandering.

The marking unit is not limited to any specific type, so any marking unit that can form markings which can be detected or recognized by a recognizing unit on the film which is used for a display apparatus such as LCD, etc., while not damaging the film. A laser generator as the marking unit (when the marking unit includes a first marking unit and a second marking unit, both can be laser generators) may be used for more accurate measurement and control.

The marking unit can be configured to include one or more marking units.

When the marking unit includes one marking unit, the marking unit can recognize and compute meandering of patterns which is caused by a lateral movement of a central axis of the film, etc., that is, movement of the patterns in a direction perpendicular to a transferring direction. In this case, a meandering distance L can be computed using a method which is described below, and a meandering angle θ is 0°.

When the marking unit includes two or more marking units, it is possible to compute every types of meandering. The specific method for computing a meandering distance L and a meandering angle θ using the two or more marking units will be described below.

Figure 3:
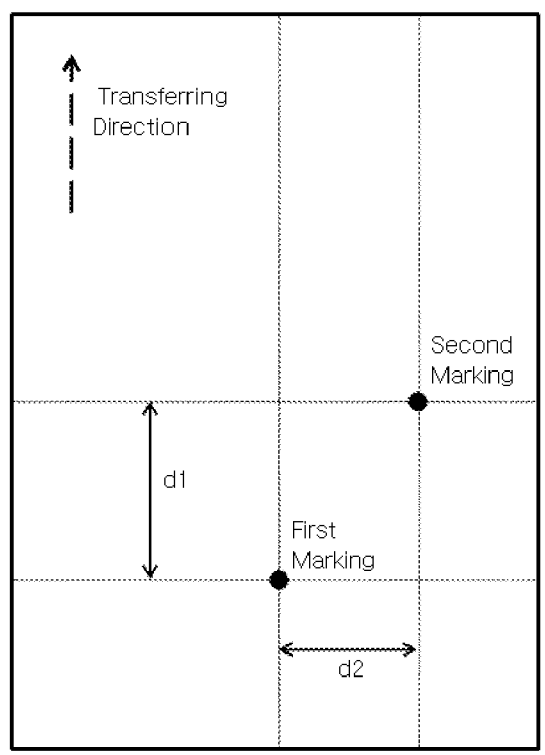
FIG. 3 illustrates a first marking marked by a first marking unit and a second marking marked by a second marking unit in an embodiment of the present invention.

The two or more marking units may include a first marking unit, and a second marking unit which is located at a distance d1 in a transferring direction of the film and a distance d2 in the direction perpendicular to the transferring direction of the film from the first marking unit (d2 can be zero.) An example of shapes of markings which is formed by the above-described marking unit is shown in FIG. 3.

Moreover, the marking unit may further include a unit for adjusting distance between the first marking unit and the second marking unit while forming markings, and in some cases, a position of either the first marking unit or the second marking unit can be fixed.

When the marking unit includes two or more marking units, each of the marking units may form markings with different shapes or colors so that each of the markings can be easily distinguished from each other or from noises.

When meandering is not occurred, the markings draw a straight dotted line. When meandering is occurred, the markings draw a line, for example, as shown in FIG. 2B. The shape of the line can be affected by the distance and angle of the meandering or the transferring speed of the film. The line is recognized by the recognizing unit which will be described below.

The control device according to an embodiment of the present invention includes a recognizing unit located at the rear of the marking unit.

The recognizing unit is located at the rear of the marking unit (in view of a transferring direction of the film) and recognizes positions of the markings as the film is transferred to a recognition area (i.e., an area where a camera module can capture images if the recognizing unit includes a camera module.)

Figure 5:
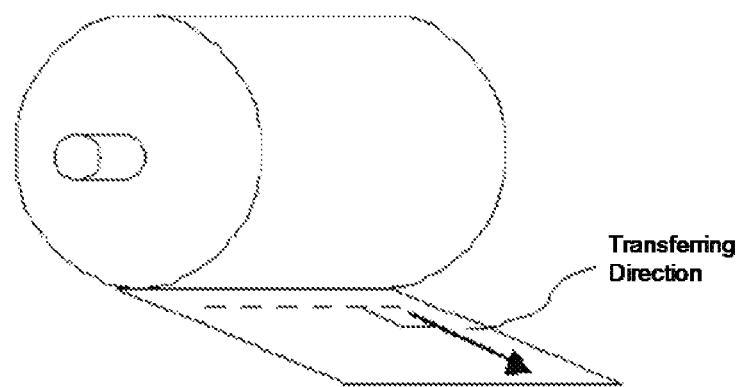
FIG. 5 shows a transferring direction of a film according to an example of the present invention.

In the present invention, the transferring direction means a direction perpendicular to a central axis of a rolled film as shown in FIG. 5. The transferring direction is parallel to a machine direction of the film when meandering is not occurred.

The recognizing unit may include one or more recognition areas. According to the number of the recognition areas, the markings which are formed by the first marking unit and the second marking unit can be recognized simultaneously or respectively.

Any recognizing unit which can recognize or detect markings on the film and calculate positions or coordinates of the markings may be used as the recognizing unit of the present invention. For example, the recognizing unit may include a camera module that captures images including the markings of the film, and a computer device that stores the captured images and calculates positions of the markings from the captured images.

When a high resolution vision system which can recognize the markings with diameters of some tens of micrometers is used, it is possible to measure changes in positions of the markings more precisely and to control the meandering more accurately. For example, camera module which has a resolution with dimensions on the micrometer level, for example less than ten micrometers, may be used.

The recognizing unit may further include a unit that distinguishes noises from the markings. The unit is especially useful when the marking unit includes a laser generator because it can prevent foreign substances due to the laser or dusts from being detected as markings.

Further, for minimize errors due to a shape of the marking, boundaries of each markings and coordinates of centers of the markings may be recognized as the positions of the markings.

The control device of an embodiment of the present invention includes a computing unit.

The computing unit is configured to compute meandering of patterns by a comparison between a known reference position which is determined based on the film transferring equipment as a reference and positions of the markings which are recognized by the recognizing unit.

Figure 14A:
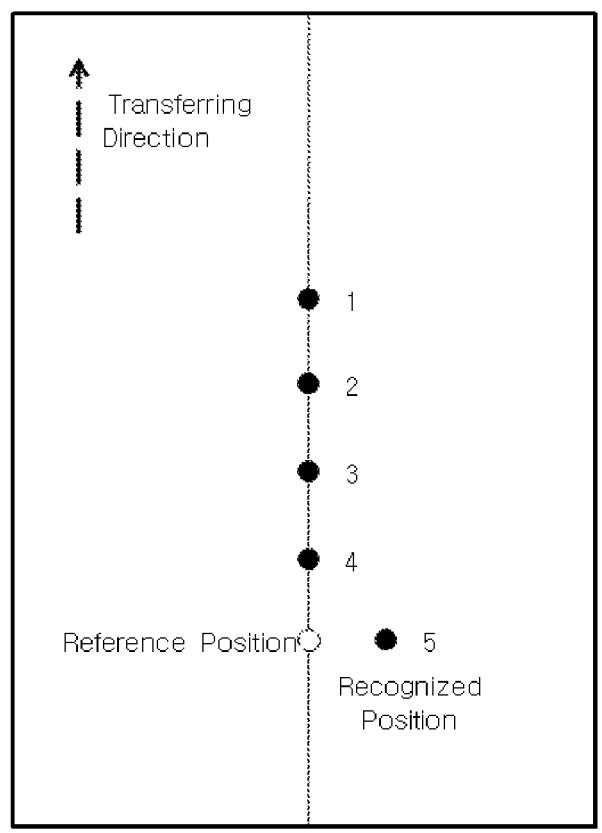
FIGS. 14A and 14B shows a method for calculating a meandering distance L.
Figure 14B:
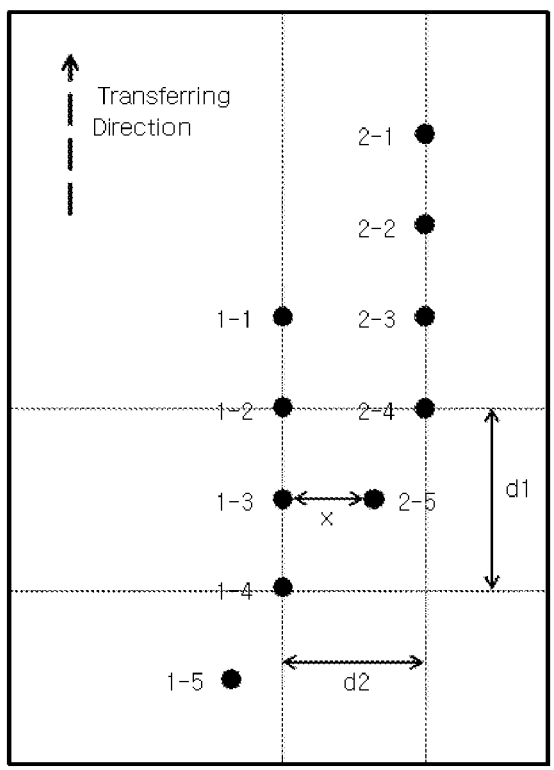

FIGS. 14A and 14B show methods for calculating a meandering distance L.

FIG. 14A illustrates an embodiment that the marking unit includes one marking unit. In this case, markings 1, 2, 3, and 4 are formed in order as the film progresses. When the central axis of the film moves to the left, the fifth marking deviates from its reference position (dotted circle) and is formed in a position denoted as 5 in the drawing, and the position of the fifth marking is recognized by the recognizing unit. In this case, the meandering distance L is a distance between the reference position and the recognized marking position.

FIG. 14B illustrates an embodiment that the marking unit includes a first marking unit, and a second marking unit located at a distance d1 in a transferring direction of the film and a distance d2 in the direction perpendicular to the transferring direction of the film from the first marking unit.

In this case, markings 1-1/2-1, 1-2/2-2, 1-3/2-3, 1-4/2-4 are formed in order as the film progresses (1-A denotes a marking formed by the first marking unit, and 1-B denotes a marking formed by the second marking unit, where A and B are integers between 1 and 5.) For example, when the recognition area of the recognizing unit is arranged perpendicular to the transferring direction, the recognizing unit recognizes the markings 1-1 and 2-3 at the same time, and then recognizes 1-2 and 2-4. When the central axis of the film moves to the right after 1-4 and 2-4 are formed, the fifth markings deviate from their reference positions by the distance L and are formed in positions denoted as 1-5 and 2-5 in the drawing.

The computing unit computes a meandering distance L by computing the distance x between 1-3 and 2-5 which are recognized by the recognizing unit and subtracting x from d2 (i.e., the distance between the first and the second marking unit in a direction perpendicular to the transferring direction.) If d2−x is a positive number, it means that the film deviates to the right from the transferring direction, and if d2−x is negative, the film deviates to the left.

Figure 4A:
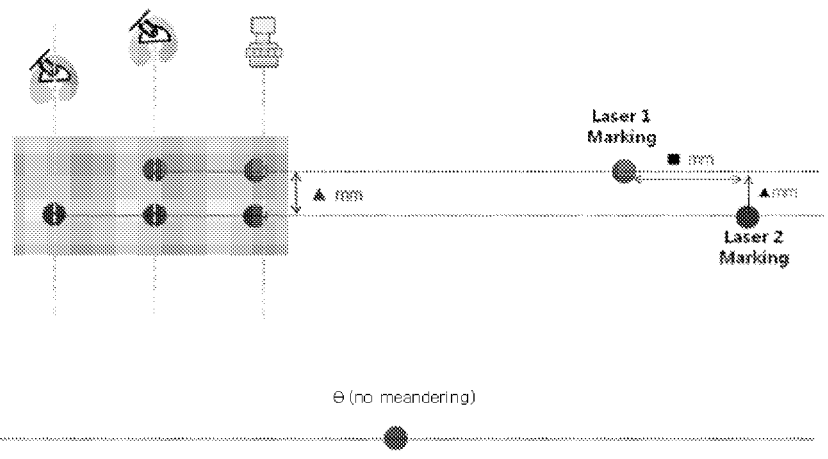
FIGS. 4A, 4B and 4C show methods for calculating a meandering distance and a meandering angle by a calculating unit of the present invention when a direction of a film is rotated at a certain angle from a transferring direction of the film.
Figure 4B:
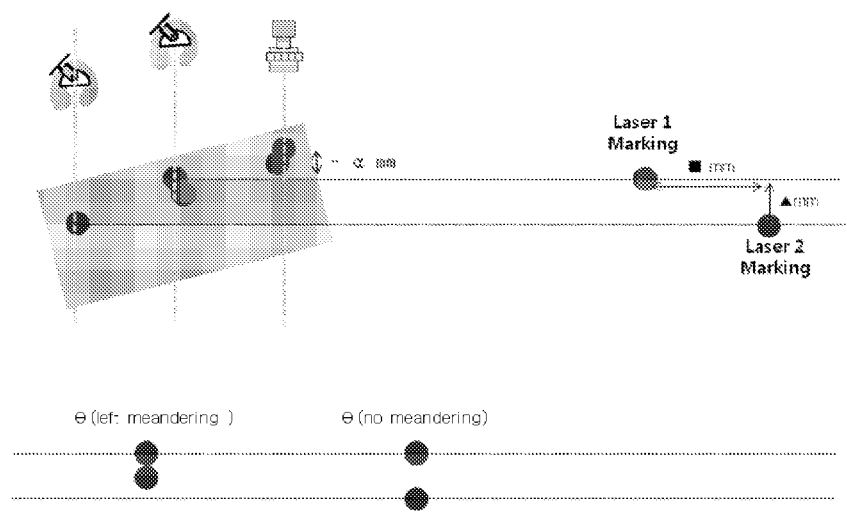
Figure 4C:
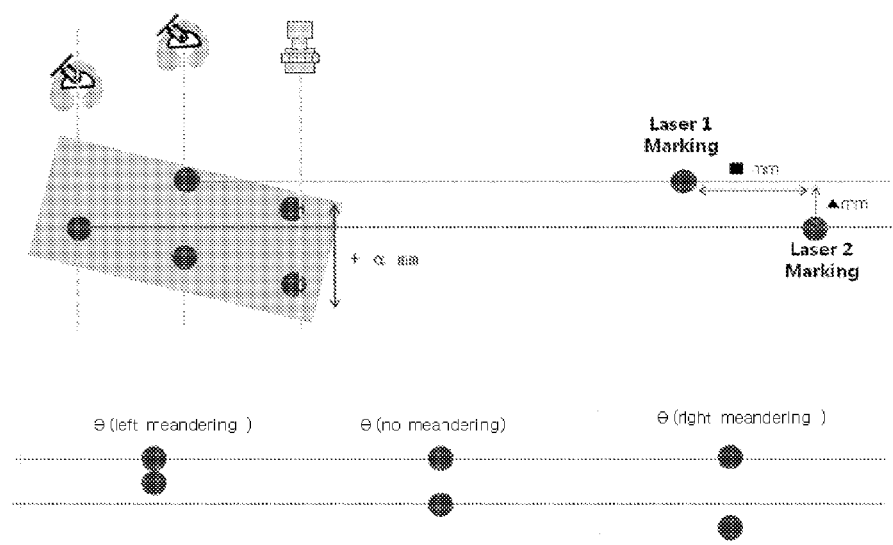

FIGS. 4A through 4C show methods for calculating a meandering angle θ.

In order to calculate the meandering angle θ, the marking unit needs to have two or more marking units. When the marking unit includes a first marking unit and a second marking unit located at a distance d1 in a transferring direction of the film and a distance d2 in the direction perpendicular to the transferring direction of the film from the first marking unit as shown in FIG. 14B, the meandering angle θ can be calculated using the distance between the reference position of the marking unit and actual marking position, d1 and d2.

FIG. 4A illustrates an example without meandering. In this case, the recognized distances between markings marked by the first marking unit and the second marking unit are same as d2. The meandering angle θ can be calculated using Formula 1 (d1 is a known value.)

$$\theta = a\tan[d2-d2)/d1] = 0° \quad \text{[Formula 1]}$$

FIG. 4B illustrates an example when meandering is occurred to the left from the transferring direction. A first marking (a marking marked by the first marking unit) which is marked first moves at a left meandering angle θ to the position where the second marking (a marking marked by the second marking unit) is formed. In this case, distances between markings formed by the first marking unit and the second marking unit get closer as the film progresses. The recognizing unit recognizes the first marking and the second marking, and the meandering angle θ can be calculated using Formula 2. In Formula 2, ▲ represents a mechanically decided distance between the first and the second marking unit (or a distance between the first marking and the second marking where there is no meandering), and α is a changed value of ▲ as a result of the meandering. The α is denoted with the minus sign "−" (i.e., −α) in FIG. 4B and Formula 2 because the distance between the markings gets closer than ▲ in FIG. 4B due to the meandering.

$$\theta = a\tan[(d2-d2-\alpha)/d1] = a\tan[(-\alpha)/d1] = -\blacktriangle° \quad \text{[Formula 2]}$$

FIG. 4C illustrates an example when the meandering is occurred to the right from the transferring direction. A first marking (a marking marked by the first marking unit) which is marked first moves at a right meandering angle θ to the position where the second marking (a marking marked by the second marking unit) is formed. In this case, distances between markings formed by the first marking unit and the second marking unit grow apart as the film progresses. The recognizing unit recognizes the first marking and the second marking, and the meandering angle θ can be calculated using Formula 3. In Formula 3, ▲ represents a mechanically decided distance between the first and the second marking unit (or a distance between the first marking and the second marking where there is no meandering), and α is a changed value of ▲ as a result of the meandering. The α is denoted with the plus sign "+" (i.e., +α) in FIG. 4C and Formula 3 because the distance between the markings grows farther than ▲ in FIG. 4C due to the meandering.

$$\theta = a\tan[(d2-d2+a)/d1] = a\tan[(+\alpha)/d1] = +\blacktriangle° \quad \text{[Formula 3]}$$

The first and the second marking units may be arranged on a straight line perpendicular to a pattern mask (or pattern roll) of the pattern forming equipment.

The calculated meandering angle θ is used to correct the position of the pattern forming equipment. At the same time, the position of the first marking unit (the leading marking unit) is adjusted by a in the direction perpendicular to the transferring direction.

The computing unit may further include a unit that periodically adds up the amount of meandering (i.e., the meandering distance L, the meandering angle θ, or both.) In this case, the control unit which is described below can be configured to generate a correction signal only when the added up amount is greater than a predetermined threshold value.

The control device of the embodiment of the present invention includes a control unit that generates a correction signal at least for the marking unit and the pattern forming equipment. The control unit generates a correction signal for correcting positions of the marking unit and the pattern forming equipment corresponding to the computed amount of meandering of patterns by the computing unit.

The control unit may generate the correction signal corresponding to the amount of the meandering of the patterns (i.e., the meandering distance L, the meandering angle θ, or both) whenever meandering is recognized. Alternatively, the control unit may generate the correction signal periodically corresponding to the added up amount of meandering (i.e., the added up meandering distance L, the added up meandering angle θ, or both). Alternatively, the control unit may generate the correction signal only when the added up amount is greater than predetermined threshold value.

For example, the control unit may generate the correction signal when the added up meandering distance is greater than 20 μm. Or, for example, the control unit may generate the correction signal when the added up meandering angle is greater than 0.5°

When necessary, the control unit may further generate an additional correction signal for adjusting positions of other components which are needed to be adjusted according to the amount of the meandering, such as the recognizing unit or a cutting unit of the film, etc.

The control unit may generate and transmit a correction signal for a part of the marking unit. For example, when the marking unit includes a first marking unit and the second marking unit, the control unit may generate a correction signal for either the first marking unit or the second marking unit or both. Alternatively, when the first marking unit is adjustable while the second marking unit is fixed, the control unit may generate a correction signal only for the first marking unit.

The control device of the present invention includes a correction unit that receives the correction signal and corrects or adjusts positions of the marking unit and the pattern forming equipment based on the received correction signal before forming patterns on the film.

The correction signal may be a signal for moving the marking unit and the pattern forming equipment by a certain distance, or rotating the marking unit and the pattern forming equipment by a certain angle, or both.

Therefore, correcting or adjusting positions of the marking unit and the pattern forming equipment to move the marking unit and the pattern forming equipment by a certain distance, or rotate the marking unit and the pattern forming equipment by a certain angle, or both.

As mentioned above, the position of the marking unit is adjusted along with the position of the pattern forming equipment so that the control device of the embodiment of the present invention can recognizes the normal state (i.e., a state without meandering) when the meandering goes back to normal. Therefore, according to the embodiment of the present invention, it is possible to solve the problem being unable to form uniform patterns because a part of the boundary of the pattern is overlapped.

An embodiment of the present invention may be configured to correct the position of the pattern forming equipment before forming patterns.

The control device of the embodiment of the present invention may include an initializing unit that sets corrected positions of the pattern forming equipment and the marking unit as a new reference position after positions of the pattern forming equipment and the marking unit are corrected by the correction unit.

A meandering control method which is executed on the control device of the embodiment of the present invention may include, for example, a step for periodically forming a first marking and a second marking using a first marking unit and a second marking unit which are arranged in respectively predetermined positions, a step for periodically recognizing the first marking and the second marking and calculating a distance between the first marking and the second marking, a step for calculating and adding up a meandering distance and a meandering angle using the distance between the first marking and the second marking, and a reference distance between the first marking and the second marking, a step for generating correction signal for correcting at least one of the positions of the pattern forming equipment, the first marking unit, or the second marking unit when the added up meandering distance or the meandering angle is greater than predetermined values, and a step for receiving the correction signal and correcting at least one of the positions of the pattern forming equipment, the first marking unit, or the second marking unit.

The control method of the embodiment of the present invention includes steps for moving the marking unit and the pattern forming equipment by a certain distance, or rotating the marking unit and the pattern forming equipment by a certain angle, or both.

Figure 13:
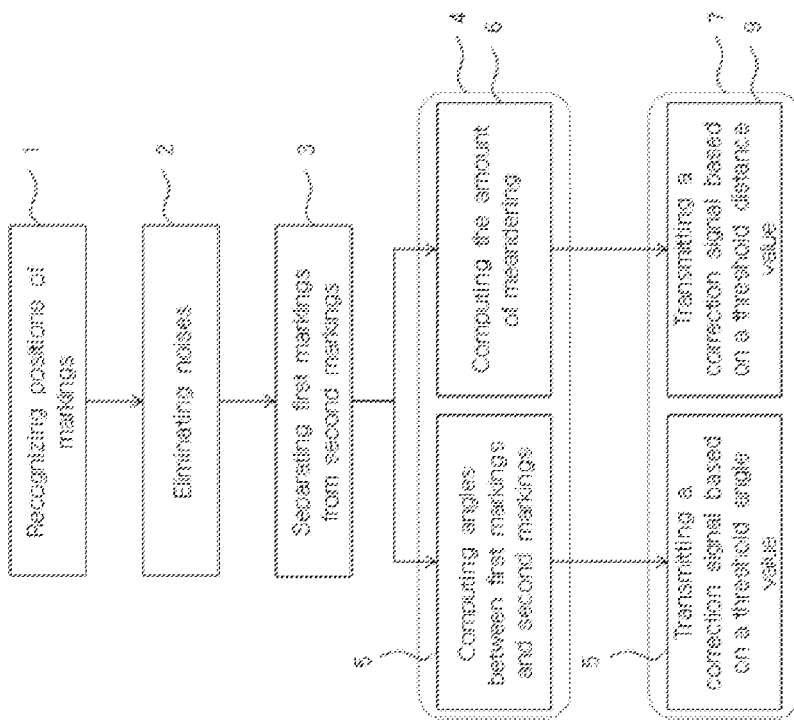
FIG. 13 shows an example for controlling meandering according to the present invention.

The control method of the present invention is preferably as shown in FIG. 13.

The control device of the embodiment of the present invention can be used single-handedly for effectively controlling meandering of patterns on a film. According to another embodiment of the present invention, an edge position controller (EPC) may be used in combination with the control device.

Hereafter, examples are provided for ease of understanding the present invention. However, the following embodiments are provided only as examples of the present invention and it will be readily apparent to one skilled in the art that varying substitutions and modifications may be made to the invention disclosed herein without departing from the scope and spirit of the invention and that such modifications and variations are considered to be within the scope of this invention as defined by the appended claims.

EXAMPLE

Figure 6:
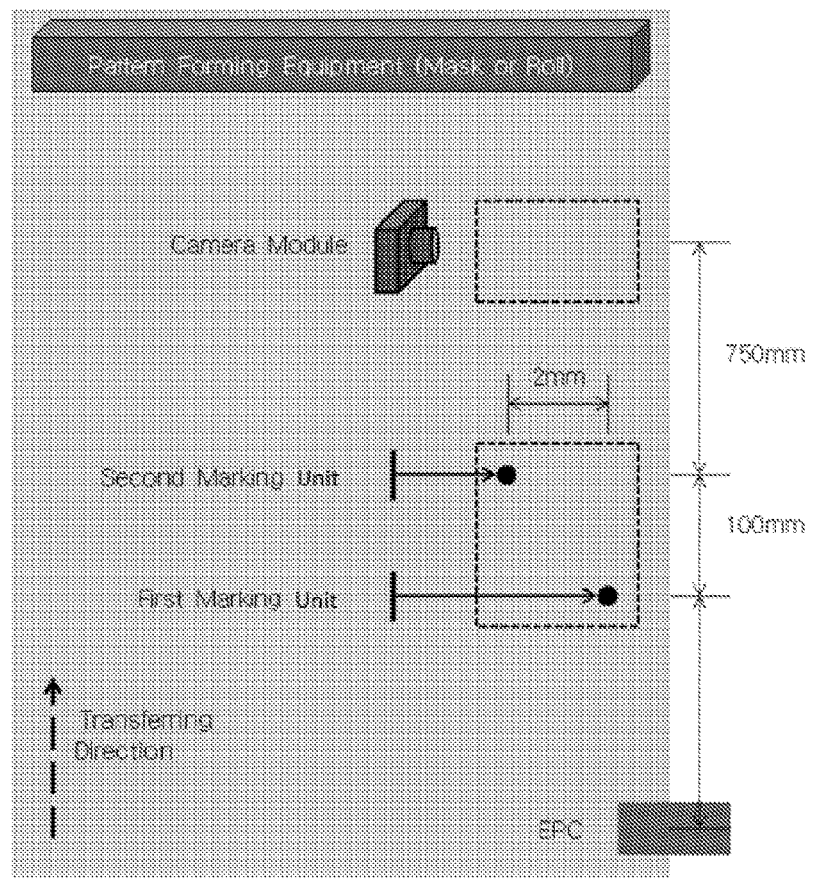
FIG. 6 shows a meandering control device according to an example of the present invention.

FIG. 6 illustrates an exemplary control device according to an embodiment of the present invention.

As shown in FIG. 6, a marking unit includes a first marking unit and a second marking unit. Linear laser generators having width 15±3 μm are used as the first and the second marking unit. The laser generators are arranged near the right border of the rolled film and the distance between the first marking unit and the second marking unit is 100 mm in the transferring direction of the film (d1=100 mm) and 2 mm in the direction perpendicular to the transferring direction of the film (d2=2 mm), therefore, when the meandering angle θ is changed by 0.1°, d2 increases or decreases by 177 μm [100*tan(0.1)μm].

The recognizing unit includes a camera module which has a resolution with dimensions on the 3.0 μm and a computer device that can calculate positions of the markings from the captured images from the camera module. The camera module is arranged at the rear of the second marking unit at a distance of 750 mm.

An exposure apparatus and a mask are arranged at the rear of the recognizing unit, two fixed marks are arranged at each side of the mask to check alignment of the mask, and another camera module is installed on the mask for recognizing the fixed marks. The distance between the fixed marks and the other camera module is 45 mm.

Moreover, the computing unit is configured to compute the meandering distance L and the meandering angle θ using predetermined values of d1 and d2, and the distance between the first and the second marking unit which is recognized by the recognizing unit.

The control unit is designed to transmit a correction signal to the pattern forming equipment and the marking unit based on the meandering distance L and the meandering angle θ every 20 mm of the progress of the film.

Experiment

Occurrence of the meandering of a pattern on the film

Whether the meandering occurs or not is checked in the cases of line speeds of 3 m/min. and 5 m/min., and tensions of the film of 130 N, 200 N, and 250 N.

As the result of the experiment, as shown in Table 1, considerable meandering occurs in every case regardless of the edge position controller (ETC).

TABLE 1

| Line speed (m/min.) | Tension (N) | EPC | Meandering angle (deg) | Maximum movement of the center in a unit section (um) | | | |
|---|---|---|---|---|---|---|---|
| | | | | 1 | 10 | 100 | 1000 |
| 3 | 130 | on | +/−0.06 | 5 | 17 | 48 | 64 |
| | | off | +/−0.06 | 6 | 17 | 68 | 125 |
| | 200 | on | +/−0.06 | 5 | 11 | 49 | 58 |
| | | off | +/−0.06 | 3 | 9 | 39 | 52 |
| | 250 | on | +/−0.05 | 3 | 11 | 19 | 33 |
| | | off | +/−0.06 | 13 | 20 | 48 | 72 |
| 5 | 130 | on | +/−0.10 | 13 | 28 | 55 | 95 |
| | | off | +/−0.15 | 16 | 64 | 123 | 182 |
| | 200 | on | +/−0.13 | 12 | 35 | 68 | 101 |
| | | off | +/−0.15 | 71 | 71 | 75 | 87 |
| | 250 | on | +/−0.13 | 51 | 59 | 61 | 78 |
| | | off | +/−0.15 | 45 | 48 | 92 | 105 |

2. Controlling meandering of patterns on the film according to an embodiment of the present invention A simulation for controlling meandering of the film using the control device according to the example above was carried on in the case of the line speed of 5 m/min. and the tensions of the film of 200 N. EPC is not applied and the threshold value of the meandering is 10 nm.

Figure 8A:
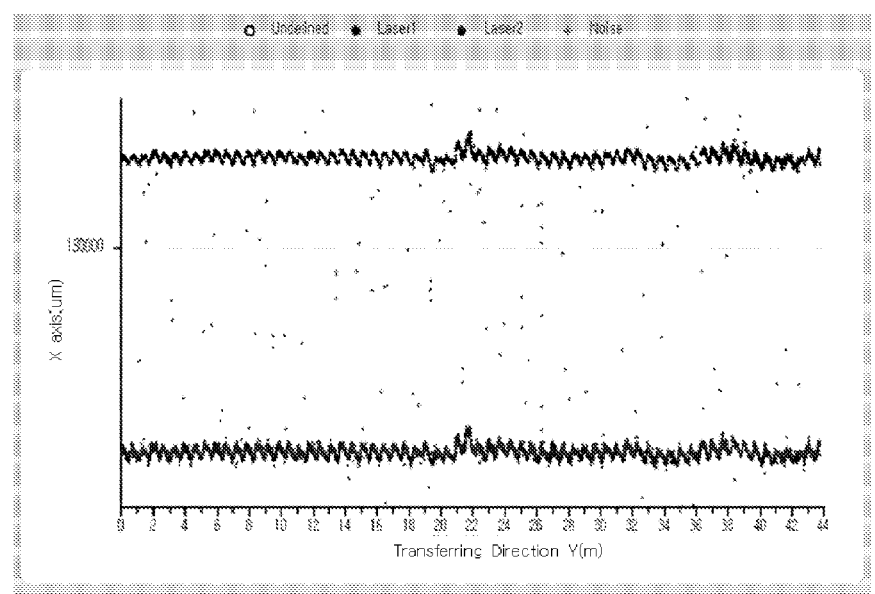
FIGS. 8A and 8B show traces of the marks by the first and second marking units which are recognized by a recognizing unit, and 2-dimensional block matrix formed by dividing the marking data into block according to the recognized coordinates.
Figure 8B:
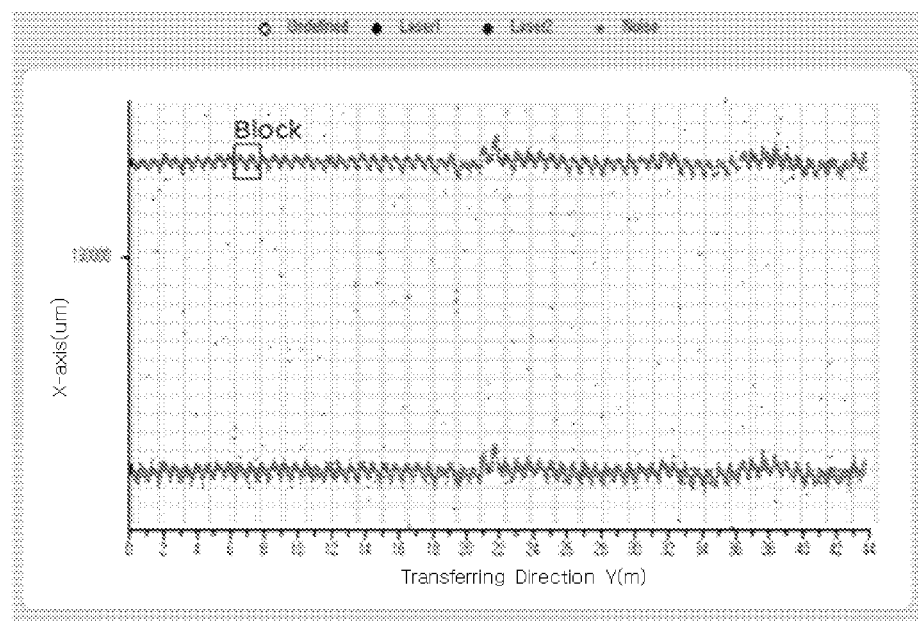
Figure 9:
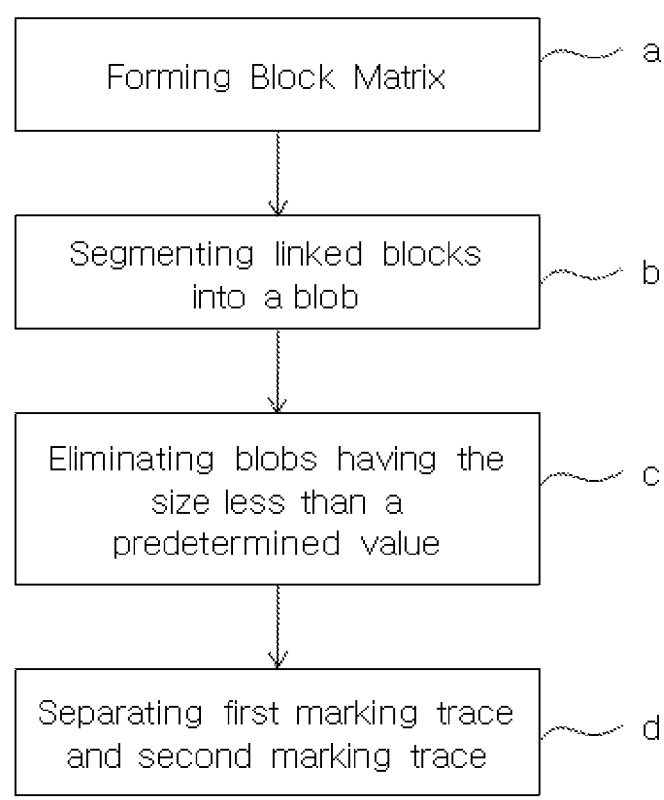
FIG. 9 illustrates a method for separating first markings and second markings from noises according to an embodiment of the present invention.
Figure 10A:
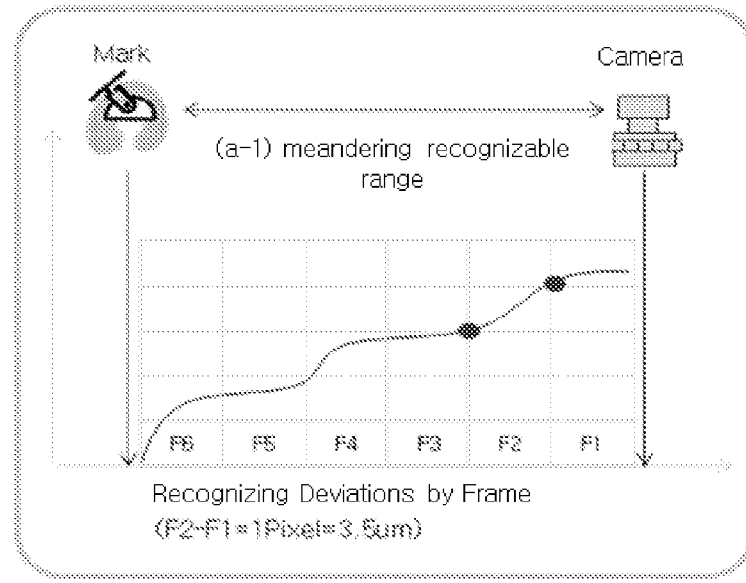
FIGS. 10A and 10B illustrate methods for calculating a meandering distance and a meandering angle according to a computing unit of an embodiment of the present invention.
Figure 10B:
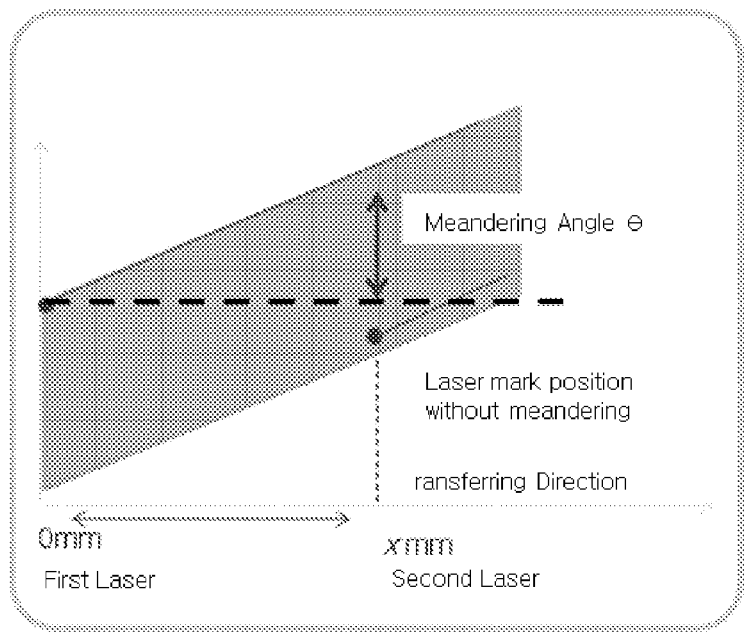

At first, eliminate noises and extract traces of the marks by the first and second marking units from marking data shown in FIG. 8A which are recognized by the recognizing unit. Specifically, form a 2-dimensional block matrix by dividing the marking data into block according to the recognized coordinates, segment linked blocks into a blob and eliminates blobs with the size of less than 3,000 μm from the marking data as noises, and investigate major linking curves and separate the first marking trace (the upper line) and the second marking trace (the lower line) (refer to FIG. 9.)

When F denotes the whole block set, and $S_1, S_2, \ldots, S_n$ respectively denote each of the block including F, they satisfy the following Formula 4.

$$\bigcup_{i=1}^{n} S_i = F, \; S_i \cap S_j = \phi, \; \forall \, i \neq j \quad \text{[Formula 4]}$$

The computing unit computes the meandering distance L and the meandering angle θ based on the data regarding the first marking and the second marking.

Figure 11:
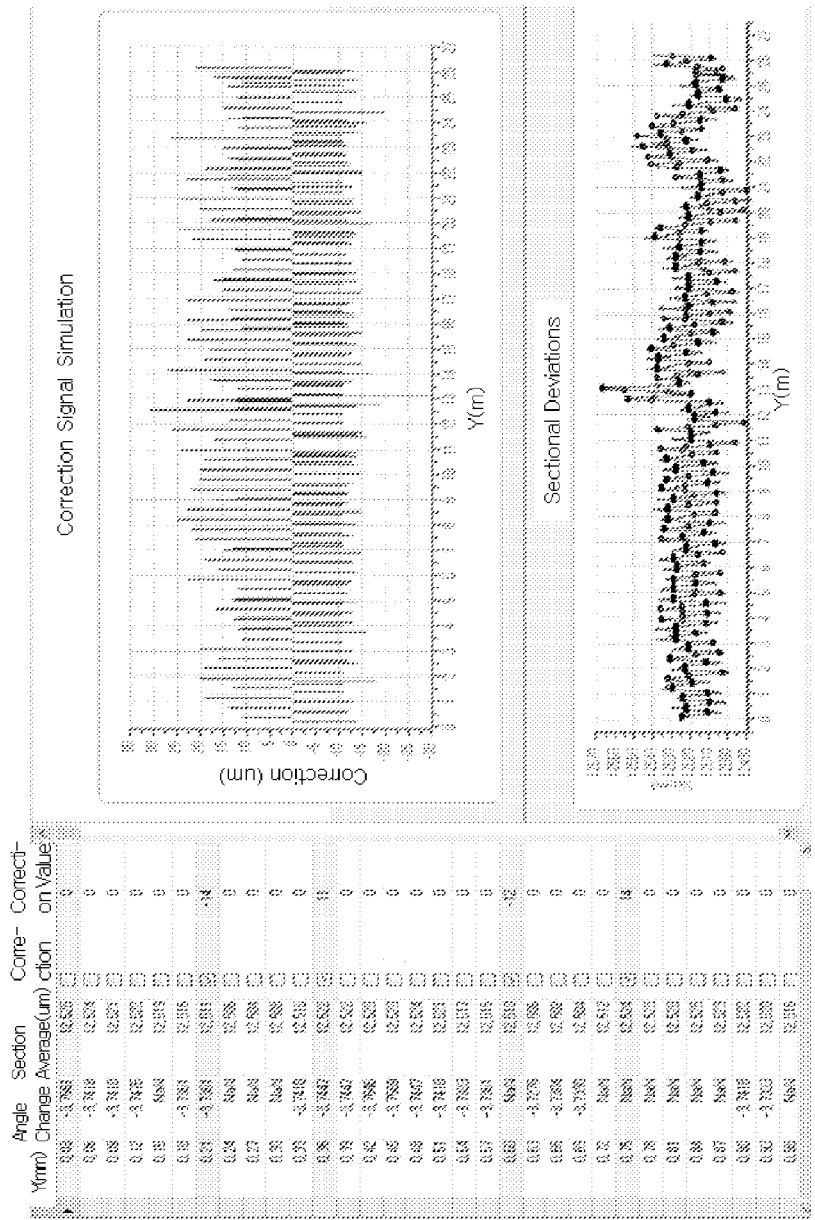
FIG. 11 shows a result of generating correction signal for adjusting positions of a pattern forming equipment and a second marking unit based on the computed meandering distance and the meandering angle.

The meandering angle θ is calculated using Formula 5 for each of the sections as shown in FIG. 11. The distance d between the first marking and the second marking is calculated using Formula 5 and the angle θ is obtained using the tangent value of d (tan(d)). In Formula 5, d3 is a distance between a first laser generator and a second laser generator in a transferring direction, and d4 is a distance between the first laser generator and the second laser generator in a direction perpendicular to the transferring direction. In the simulation described above, d3 is 100 mm and d4 is 2 mm.

$$d = \frac{[\text{first marking} - \text{second marking}] - d4}{d3} \quad \text{[Formula 5]}$$

The meandering distance L is calculated using Formula 6 with coordinates of the second markings for each of the sections as shown in FIG. 11. In Formula 6, $x_1, \ldots, x_n$, are coordinates in the direction perpendicular to the transferring direction.

$$L = \text{Median}(x_1, x_2, \ldots, x_n) \quad \text{[Formula 6]}$$

The control unit transmits the correction signal when the meandering distance L is greater than the predetermined value of 10 μm, and the corrected position is set as a new reference position. In FIG. 11, sections in which the correction signal is transmitted are marked as checked.

Figure 12:
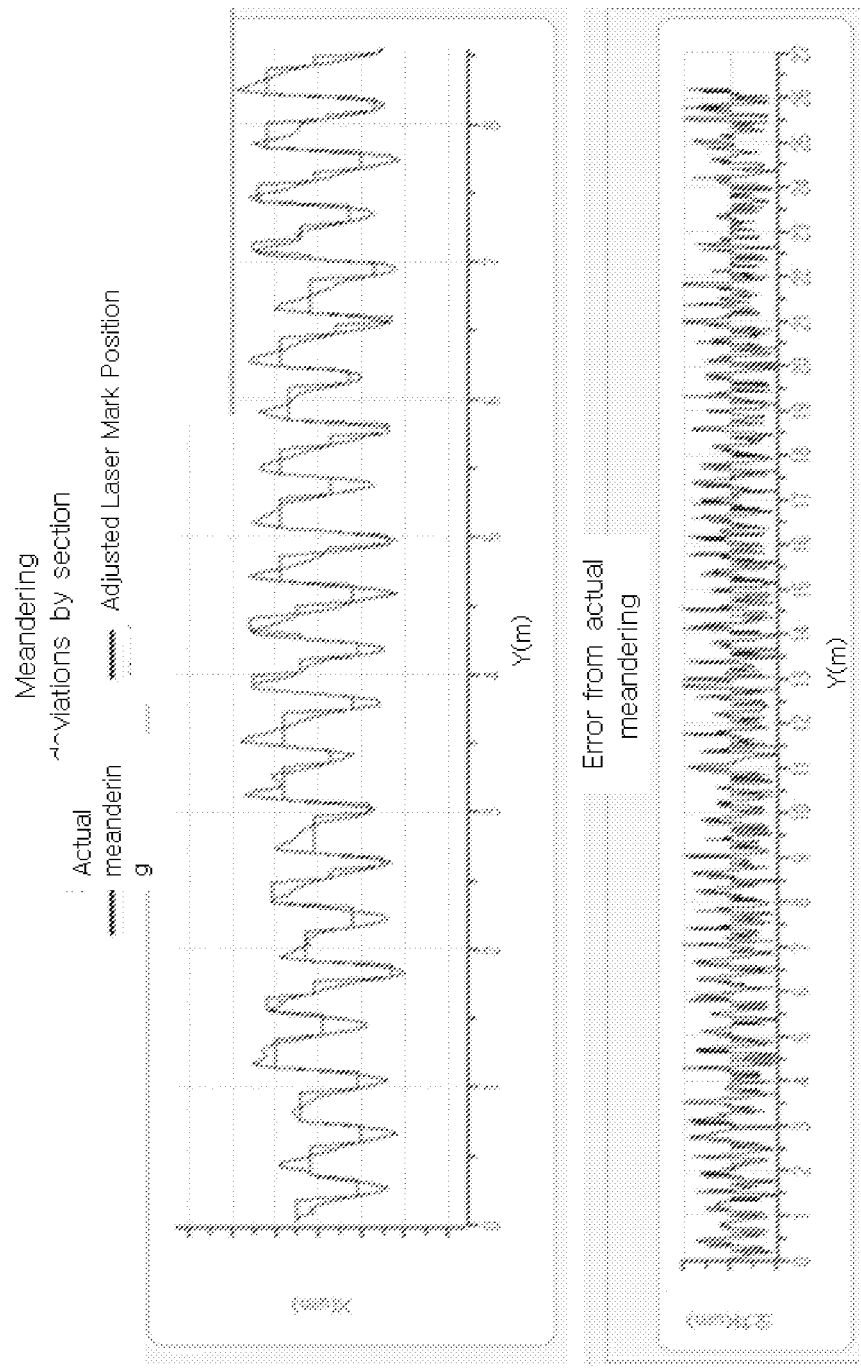
FIG. 12 shows a result of controlling meandering according to the experiment of the present invention.

FIG. 12 shows a result of controlling meandering according to the experiment of the present invention.

According to one or more embodiments of the present invention, it is possible to easily detect meandering of patterns and measure a meandering distance L and a meandering angle θ. Based on the distance and the angle, the present invention can provide a correction signal which can correct the position of a pattern forming equipment, so that the pattern forming equipment can form stable patterns.

One or more embodiments the present invention enables to manage quality of films because it is possible to detect and correct meandering before forming patterns on a film.

According to one or more embodiments of the present invention, it is possible to manufacture accurate patterned films because positions of the pattern forming equipment and a marking unit according to the computed amount of meandering.

According to one or more embodiments of the present invention, it is possible to measure and control meandering of the film on the micrometer level when applied with a precise laser generator and a high resolution vision system.

The control device of the present invention may be used single-handedly or in combination with an edge position controller for controlling meandering when manufacturing patterned films for displays such as three-dimensional displays.

What is claimed is:

1. A control device for preventing meandering of patterns for use in a patterned film manufacturing device which comprises a film transferring equipment and a pattern forming equipment, the control device comprising:
    a marking unit that forms markings on a predetermined reference position on the film, the predetermined reference position being positioned using the film transferring equipment as a reference, the marking unit comprising a marking unit that periodically forms markings on the film;
    a recognizing unit located at the rear of the marking unit, the recognizing unit that recognizes positions of the markings on the film;
    a computing unit that computes an amount of meandering based on differences between the reference position and the recognized positions of the markings, wherein the computing unit computes the amount of meandering which is caused by a lateral movement of a central axis of the film based on differences in distances between the reference position of the marking unit and the recognized positions of the markings, wherein the lateral movement is a movement of the central axis of the film by a distance L in a direction perpendicular to a transferring direction of the film;
    a control unit that generates a correction signal for correcting positions of the marking unit and the pattern forming equipment corresponding to the computed amount of meandering; and
    a correction unit that receives the correction signal and corrects the positions of the marking unit and the pattern forming equipment based on the received correction signal.

2. The control device of claim 1, wherein the control unit generates the correction signal for moving the positions of the marking unit and the pattern forming equipment by the distance L in a direction perpendicular to the transferring direction of the film.

3. The control device of claim 1, wherein the marking unit comprises:
    a first marking unit; and
    a second marking unit, located at a distance d1 in a transferring direction of the film and a distance d2 in the direction perpendicular to the transferring direction of the film, from the first marking unit.

4. The control device of claim 3, wherein the marking unit further comprises a unit that adjusts a distance between the first marking unit and the second marking unit while the markings are being formed.

5. The control device of claim 3, wherein a position of either the first marking unit or the second marking unit is fixed.

6. The control device of claim 5, wherein the computing unit computes a meandering distance L and a meandering angle θ using a difference in distance between a reference position of the first marking unit or the second marking unit and an actual position of marking by the first marking unit or the second marking unit, d1, and d2.

7. The control device of claim 6, wherein the control unit generates the correction signal for correcting the positions of the marking unit and the pattern forming equipment by the distance L and the angle θ.

8. The control device of claim 1, wherein the recognizing unit comprises:
    a camera module that periodically captures images comprising the markings of the film; and
    a unit that periodically stores the captured images, and calculates coordinates of the markings from the captured images.

9. The control device of claim 1, wherein the recognizing unit further comprises a unit that distinguishes noises from the markings.

10. The control device of claim 1, wherein the computing unit further comprises a unit that periodically adds up the amount of meandering.

11. The control device of claim 10, wherein the amount of meandering comprises a meandering distance L, a meandering angle θ, or both.

12. The control device of claim 11, wherein the control unit generates the correction signal when the meandering distance L which is added up by the computing unit is greater than a predetermined threshold value, the meandering angle θ which is added up by the computing unit is greater than a predetermined threshold value, or both of the meandering distance L and the meandering angle θ which are added up by the computing unit are greater than predetermined threshold values.

13. The control device of claim 3, wherein the control unit generates a correction signal for either the first marking unit or the second marking unit.

14. The control device of claim 1, wherein the pattern forming equipment comprises a mask or a roll which is arranged in a direction perpendicular to the transferring direction of the film.

15. The control device of claim 1, further comprising an initializing unit that sets corrected positions of the pattern forming equipment and the marking unit as a reference position after the positions of the pattern forming equipment and the marking unit are corrected by the correction unit.

16. The control device of claim 1, wherein the marking unit comprises a laser generator which can form markings with diameters of some tens of micrometers, and the recognizing unit comprises a high resolution vision system which can recognize the markings with diameters of less than ten micrometers.

17. The control device of claim 16, wherein the high resolution vision system recognizes coordinates of centers of the markings as coordinates of the markings for reducing errors due to shapes of the markings.

18. The control device of claim 1, wherein the control unit further generates a correction signal for correcting a position of a cutting unit of the film.

19. The control device of claim 1, wherein the recognizing unit is located at the front of the pattern forming equipment and recognizes meandering of the patterns of the film before the patterns are formed on the film.

20. A method for controlling meandering of patterns, comprising utilizing the control device of claim 1 to control the meandering of the patterns.

21. The method of claim 20, wherein the method further comprises using an edge position controller (EPC) in combination with the control device.

\* \* \* \* \*